United States Patent
Saarnivala et al.

(10) Patent No.: US 12,432,274 B2
(45) Date of Patent: Sep. 30, 2025

(54) DEVICE REGISTRATION MECHANISM

(71) Applicants: ARM IP LIMITED, Cambridge (GB); ARM LIMITED, Cambridge (GB)

(72) Inventors: Mikko Johannes Saarnivala, Oulu (FI); Szymon Sasin, Oulu (FI); Yongbeom Pak, Oulu (FI); Hannes Tschofenig, Tirol (AT)

(73) Assignees: ARM IP LIMITED, Cambridge (GB); ARM LIMITED, Cambridge (GB)

(*) Notice: Subject to any disclaimer, the term of this patent is extended or adjusted under 35 U.S.C. 154(b) by 0 days.

(21) Appl. No.: 17/310,369

(22) PCT Filed: Jan. 9, 2020

(86) PCT No.: PCT/GB2020/050044
§ 371 (c)(1),
(2) Date: Jul. 29, 2021

(87) PCT Pub. No.: WO2020/157450
PCT Pub. Date: Aug. 6, 2020

(65) Prior Publication Data
US 2022/0103634 A1 Mar. 31, 2022

(30) Foreign Application Priority Data
Feb. 1, 2019 (GB) ...................... 1901417

(51) Int. Cl.
*H04L 67/12* (2022.01)
*H04L 67/04* (2022.01)
(Continued)

(52) U.S. Cl.
CPC .............. *H04L 67/12* (2013.01); *H04L 67/04* (2013.01); *H04L 67/1097* (2013.01); *H04L 67/51* (2022.05); *H04L 69/04* (2013.01)

(58) Field of Classification Search
CPC .......... H04L 67/12; H04L 67/04; H04L 69/04
See application file for complete search history.

(56) References Cited

U.S. PATENT DOCUMENTS

| 5,349,643 A | 9/1994 | Cox et al. |
| 5,872,968 A | 2/1999 | Knox et al. |
| (Continued) | | |

FOREIGN PATENT DOCUMENTS

| CN | 109218142 A | 1/2019 |
| EP | 2466791 A1 | 6/2012 |
| (Continued) | | |

OTHER PUBLICATIONS

"Lightweight Machine to Machine Technical Specification ; OMA-TS-LightweightM2M-VI 0-20130409-D", OMA-TS-LIGHTWEIGHTM2M-V1-0-20130409-D, Open Mobile Alliance (OMA), 4330 La Jolla Village DR., Suite 110 San Diego, CA 92122, No. 1.0, Apr. 9, 2013, pp. 1-62, ftp/Public_documents/DM/LightweightM2M/Permanent_documents/, whole document.
(Continued)

*Primary Examiner* — Hua Fan
(74) *Attorney, Agent, or Firm* — DeWitt LLP (57) ABSTRACT

Broadly speaking, the present techniques relate to a machine-implemented method for registering a device with a server, the method performed at the device comprising: applying a data-reducing function to at least one object, object instance, resource and/or resource instance at the device to generate resource data comprising compressed data representative of the at least one object object instance, resource and/or resource instance; transmitting a registration message comprising said resource data to register said device with server.

20 Claims, 7 Drawing Sheets

(51) Int. Cl.
    *H04L 67/1097*     (2022.01)
    *H04L 67/51*     (2022.01)
    *H04L 69/04*     (2022.01)

(56) References Cited

U.S. PATENT DOCUMENTS

| | | |
|---|---|---|
| 6,463,535 B1 | 10/2002 | Drews |
| 6,950,660 B1 | 9/2005 | Hsu et al. |
| 7,363,514 B1 | 4/2008 | Behren |
| 7,882,345 B1 | 2/2011 | Christensen |
| 7,971,045 B1 | 6/2011 | Currid et al. |
| 8,244,845 B2 | 8/2012 | Rao |
| 8,370,491 B1 | 2/2013 | Breau et al. |
| 9,064,117 B1 | 6/2015 | Worsley |
| 10,554,731 B2 | 2/2020 | Pak et al. |
| 2005/0010758 A1 | 1/2005 | Landrock et al. |
| 2006/0075242 A1 | 4/2006 | Aissi et al. |
| 2007/0043608 A1 | 2/2007 | May et al. |
| 2007/0220266 A1 | 9/2007 | Cooper et al. |
| 2009/0129597 A1 | 5/2009 | Zimmer et al. |
| 2009/0276620 A1 | 11/2009 | Mccarron et al. |
| 2010/0165877 A1 | 7/2010 | Shukla et al. |
| 2012/0079031 A1 | 3/2012 | Matthews et al. |
| 2013/0160094 A1 | 6/2013 | Luo |
| 2013/0227036 A1 | 8/2013 | Kang et al. |
| 2013/0324121 A1 | 12/2013 | Kwon et al. |
| 2014/0006586 A1* | 1/2014 | Hong ............... H04W 8/26 709/223 |
| 2014/0025742 A1* | 1/2014 | Ukkola ........... H04L 41/5048 709/204 |
| 2014/0089652 A1 | 3/2014 | Cerri et al. |
| 2014/0330952 A1 | 11/2014 | Starsinic et al. |
| 2015/0071139 A1 | 3/2015 | Nix |
| 2015/0296470 A1 | 10/2015 | Kim et al. |
| 2015/0305008 A1 | 10/2015 | Kim et al. |
| 2015/0319263 A1 | 11/2015 | Koch et al. |
| 2015/0358824 A1 | 12/2015 | Kim et al. |
| 2016/0065556 A1 | 3/2016 | Sasin et al. |
| 2016/0072808 A1 | 3/2016 | David et al. |
| 2016/0337453 A1 | 11/2016 | Lee |
| 2017/0039373 A1 | 2/2017 | Sasin et al. |
| 2017/0041287 A1 | 2/2017 | Pak et al. |
| 2017/0094592 A1 | 3/2017 | Tabatabaei et al. |
| 2017/0099332 A1 | 4/2017 | Bullotta et al. |
| 2017/0289806 A1 | 10/2017 | Girdhar et al. |
| 2017/0295503 A1* | 10/2017 | Govindaraju ........... H04L 69/22 |
| 2018/0217966 A1 | 8/2018 | Buttolo et al. |
| 2019/0095644 A1 | 3/2019 | Park et al. |
| 2020/0218793 A1 | 7/2020 | Storm et al. |

FOREIGN PATENT DOCUMENTS

| | | |
|---|---|---|
| EP | 3402164 A1 | 11/2018 |
| GB | 2533385 A | 6/2016 |
| KR | 20140113007 A | 9/2014 |
| WO | WO-0169888 A1 | 9/2001 |
| WO | WO-2006059195 A1 | 6/2006 |
| WO | WO-2009141493 A1 | 11/2009 |
| WO | WO-2014048236 A1 | 4/2014 |
| WO | WO-2014069968 A1 | 5/2014 |
| WO | WO-2014114354 A1 | 7/2014 |
| WO | WO-2014182674 A1 | 11/2014 |
| WO | WO-2014190177 A1 | 11/2014 |
| WO | WO-2015042370 A1 | 3/2015 |
| WO | WO-2015065913 A1 | 5/2015 |

OTHER PUBLICATIONS

Application and File history for U.S. Appl. No. 14/842,065, filed Sep. 1, 2015, Inventors: Sasin, et al.
Application and File history for U.S. Appl. No. 15/226,523, filed Aug. 2, 2016, Inventors: Sasin, et al.
Application and File History for U.S. Appl. No. 17/310,332, filed Jul. 28, 2021, Inventor: Saarnivala et al.
Combined Search and Examination Report for Great Britain Application No. GB1806259.6, mailed Jul. 12, 2018, 6 pages.
Combined Search and Examination Report under Section 17 and 18(3) for Great Britain Application No. GB1513748.2, mailed Mar. 17, 2016, 7 pages.
Combined Search and Examination Report under Sections 17 and 18(3) for Great Britain Application No. 1901414.1, mailed Aug. 16, 2019, 7 pages.
Combined Search and Examination Report under Sections 17 and 18(3) for Great Britain Application No. GB1513750.8, mailed on Mar. 17, 2016, 6 pages.
Examination Report for GB Application No. 1513748.2, mailed on Nov. 29, 2019, 7 pages.
Examination Report under Section 18(3) for Application No. GB1513750.8, mailed on Nov. 10, 2017, 3 pages.
Examination Report under section 18(3) for GB Application No. 1901414.1, mailed on Apr. 16, 2021, 4 pages.
Examination Report under section 18(3) for GB Application No. 1901414.1, mailed on Aug. 19, 2020, 3 pages.
International Preliminary Report on Patentability and Written Opinion for Application No. PCT/GB2020/050042, mailed on Aug. 12, 2021, 9 pages.
International Search Report and Written Opinion for Application No. PCT/GB2020/050042, mailed on Mar. 23, 2020, 14 pages.
Klas G., et al., "Lightweight M2M: Enabling Device Management and Applications for the Internet of Things," White Paper, Vodafone, Arm and Ericsson, Feb. 26, 2014, 16 pages.
"Lightweight Machine to Machine Technical Specification: Core," Open Mobile Alliance, Version 1.1, Retrieved from http://openmobilealliance.org/RELEASE/Lightweight/M2M/V1_1-20180612-C/OMA-TS-LightweightM2M_Core-V1_1-20180612-C.pdf on Mar. 13, 2019, Jun. 12, 2018, 23 pages . . . .
Panwar M., et al., "Security for IoT: An Effective DTLS with Public Certificates," 2015 International Conference on Advances in Computer Engineering and Applications (ICACEA), IEEE, Mar. 2015, pp. 163-166.
Schukat M., et al., "Public Key Infrastructures and Digital Certificates for the Internet of Things," IEEE 2015, 26th Irish Signals and Systems Conference (ISSC), Jun. 2015, 5 pages.
Search Report under Section 17(5) mailed on Jan. 12, 2015 for GB Application No. 1415562.6 , 5 pages.
Combined Search and Examination Report corresponding to GB 1901417.4, dated Aug. 1, 2019.
Examination Report corresponding to GB 1901417.4 dated Aug. 13, 2020.
Examination Report corresponding to GB 1901417.4 dated Dec. 22, 2020.
International Preliminary Report on Patentability corresponding to PCT/GB2020/050044, dated Aug. 12, 2021.
International Search Report and Written Opinion corresponding to PCT/GB2020/050044, dated Mar. 23, 2020.

\* cited by examiner

DEVICE REGISTRATION MECHANISM

The present techniques generally relate to registration of devices with a server, such as a server at a device management platform.

There are ever increasing numbers of devices within the home, other buildings or the outdoor environment that have processing and communication capabilities which allow them to communicate with other entities (e.g. devices, servers, services etc.) within the same network or on a different network (e.g. on the internet) to access servers or services as part of the "Internet of Things" (IoT)

For example, a temperature device in a home may gather sensed data and push the sensed data to a remote service (such as an application running in 'the cloud'). The temperature device may then be controlled remotely by the remote service via received command data.

In other examples, a pollution monitoring device in a factory may comprise a sensor to gather information from various chemical sensors and arrange maintenance based on the gathered information; whilst a healthcare provider may use devices comprising sensors, such as a heart rate monitor to track the health of patients while they are at home.

Data is generally transmitted between devices and other entities using machine-to-machine (M2M) communication techniques, and the present applicant has recognised the need for improved (M2M) communication techniques.

According to a first technique there is provided a machine-implemented method for registering a device with a server, the method performed at the device comprising: applying a data-reducing function to at least one object, object instance, resource and/or resource instance at the device to generate resource data comprising compressed data representative of the at least one object, object instance, resource and/or resource instance; transmitting a registration message comprising said resource data to register said device with server.

According to a further technique there is provided A machine-implemented method for registering a device with a server, the method performed at the server comprising: receiving resource data comprising compressed data representative of at least one object, object instance, resource and/or resource instance at the device; determining, based on or in response to the compressed data, the at least one object, object instance, resource and/or resource instance; and registering the device using the at least one object, object instance, resource and/or resource instance.

The techniques are diagrammatically illustrated, by way of example, in the accompanying drawings, in which.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and are not intended to restrict application of claimed subject matter.

Figure 1:
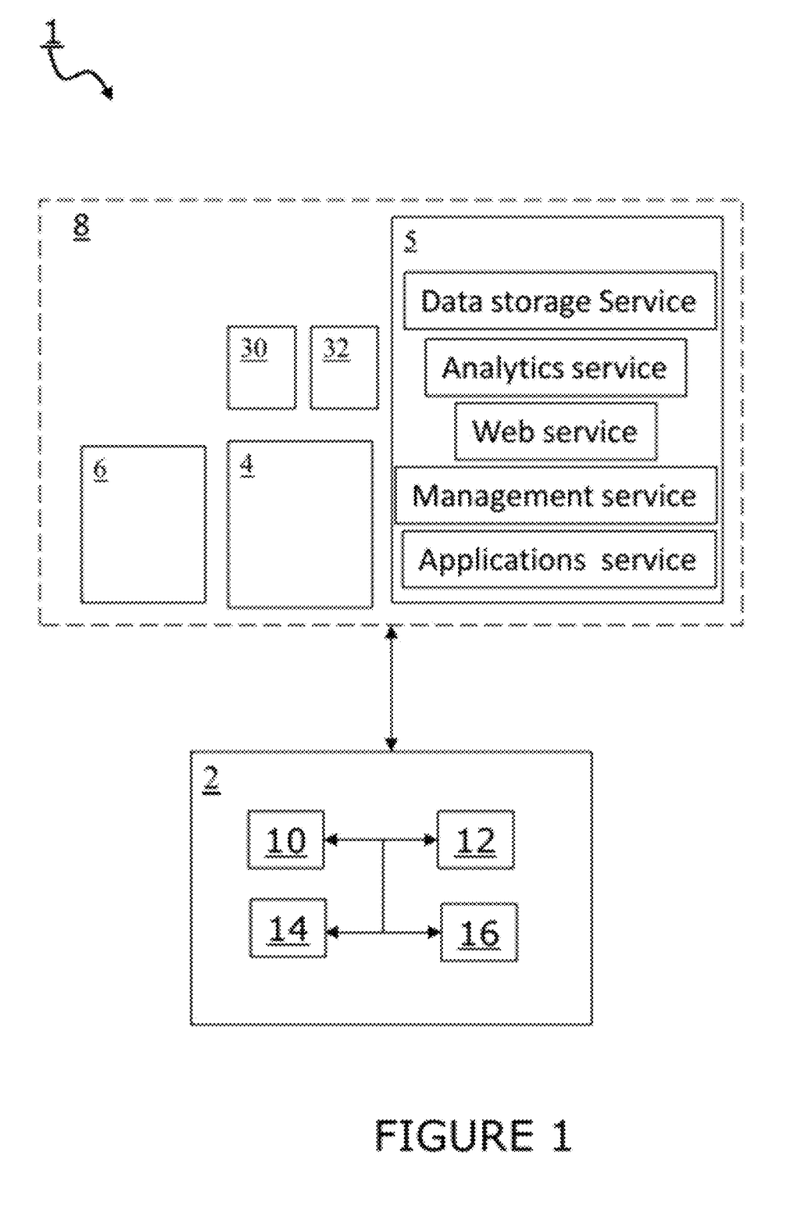
FIG. 1 shows an example deployment scenario for a device according to the present techniques.

FIG. 1 shows a deployment scenario 1 for a device 2 according to the present techniques.

Device 2 may be a computer terminal, a laptop, a tablet or mobile-phone, or may, for example, be a lightweight M2M (LwM2M) device running a LwM2M client. Device 2 can be used to provide smart functionality for streetlights, electric meters, temperature sensors, building automation, healthcare, and a range of other market segments as part of the IoT. It will be appreciated that the examples of market segments listed above are for illustrative purposes only and the claims are not limited in this respect.

Device 2 is operable to communicate with one or more servers and/or services.

As described herein a server (depicted in FIG. 1 as "server 4", "server 6") may be a single computing device or software running on a computing device. However, the claims are not limited in this respect and the server may comprise a plurality of interconnected computing devices (or software running on a plurality of interconnected devices), whereby the plurality of interconnected computing devices may be distributed over one or more public and/or private networks In the present figures server 4 may, for example, be a LwM2M server, an application server, an edge server, a computer terminal, a laptop, a tablet or mobile-phone, or an application hosted on a computing device, and which provides deployment of one or more services (depicted in FIG. 1 as "service 5"). Such services may include one or more of: web service(s); data storage service; analytics service(s), management service(s) and application service(s), although this list is not exhaustive.

In the present figures server 6 comprises a bootstrap server which is used to provision resources at the device 2. In embodiments, bootstrap server 6 may be any type of server or remote machine and may not necessarily be a dedicated bootstrap server. Generally speaking the bootstrap server 6 is any means suitable to perform a bootstrap process with the device 2 (e.g. machine, hardware, technology, server, software, etc.).

In the present examples, the server 4, bootstrap server 6 and/or services 5 are depicted as being part of a device management platform 8, such as the Pelion™ device management platform from Arm®, Cambridge, UK.

The device 2 comprises communication circuitry 10 for communicating with the one or more servers 4 and/or services 5.

The communication circuitry 10 may use wireless communication such as, for example, one or more of: Wi-Fi; short range communication such as radio frequency communication (RFID); near field communication (NFC); communications used in wireless technologies such as Bluetooth®, Bluetooth Low Energy (BLE); cellular communications such as 3G or 4G; and the communication circuitry 10 may also use wired communication such as a fibre optic or metal cable. The communication circuitry 10 could also use two or more different forms of communication, such as several of the examples given above in combination.

It will be appreciated that the device 2 could also use any suitable protocols for communications including one or more of: IPv6, IPv6 over Low Power Wireless Standard (6LoWPAN®), Constrained Application Protocol (CoAP), Message Queuing Telemetry Transport (MQTT), Representational state transfer (REST), HTTP, WebSocket, ZigBee®, Thread® although it will be appreciated that these are examples of suitable protocols.

As an illustrative example, CoAP defines the message header, request/response codes, message options and retransmission mechanisms, such as, for example, RESTful Application Programming Interfaces (APIs) on resource-constrained devices and supports the methods of GET, POST, PUT, DELETE, which can be mapped to methods of the HTTP protocol.

M2M communications are typically required to be secure to reduce the risk that malicious third parties gain access to the data, or to limit the access to data, by devices, servers or services. The device may use one or more security protocols to establish a communications path or channel for providing secure communications between entities. Exemplary security protocols may, for example, comprise Transport Layer Security (TLS) and Datagram Transport Layer Security (DTLS), whereby TLS/DTLS may be used to establish a secure channel between the device 2 and server 4 whereby TLS/DTLS include establishing communications using, certificates (e.g. X.509 certificates) and both pre-shared key and public key technology. The data (e.g. credential data) protected by TLS/DTLS may be encoded as plain text, binary TLV, JSON, CBOR, or any other suitable data exchange format.

The device 2 further comprises processing circuitry 12 for controlling various processing operations performed by the device 2.

The device 2 may further comprise input/output (I/O) circuitry 14, such that the device 2 can receive inputs (e.g. user inputs, sensor inputs, measurement inputs etc.) and or generate outputs (e.g. audio/visual/control commands etc.).

The device 2 further comprises storage circuitry 16 for storing resources, such as credential data, whereby the storage circuitry 16 may comprise volatile and/or non-volatile memory.

Such credential data may include one or more of: certificates, cryptographic keys (e.g. shared symmetric keys, public keys, private keys), identifiers (e.g. direct or indirect identifiers) whereby such credential data may be used by the device to authenticate (e.g. connect, establish secure communications, register, enrol etc.) with one or more remote entities (e.g. a bootstrap server/server/services).

Figure 2A:
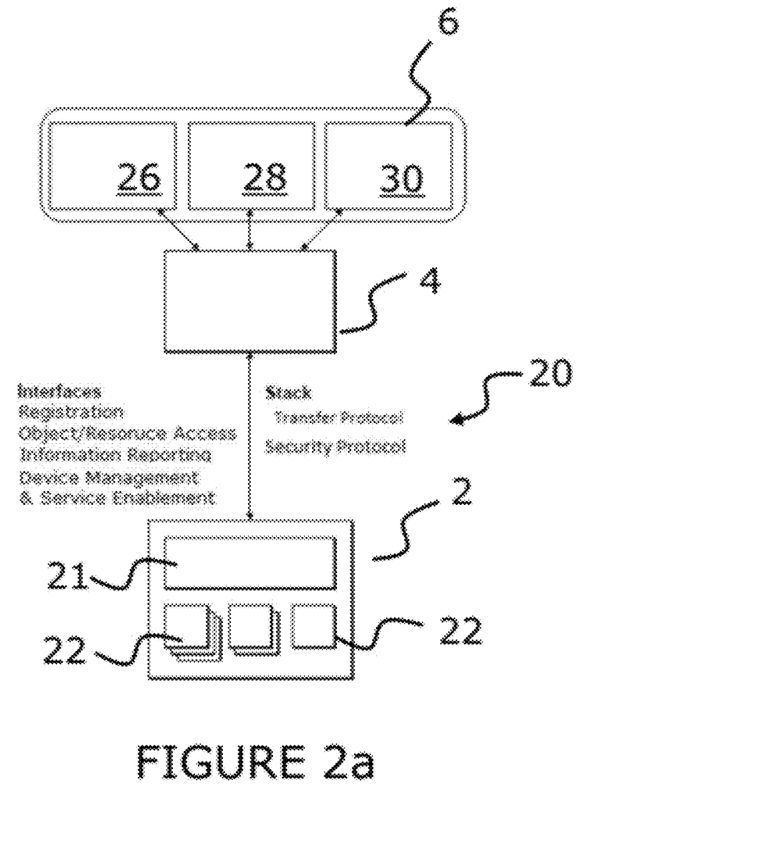
FIG. 2a shows an example architecture depicting a client-server relationship between the device of FIG. 1 and a server.
Figure 2B:
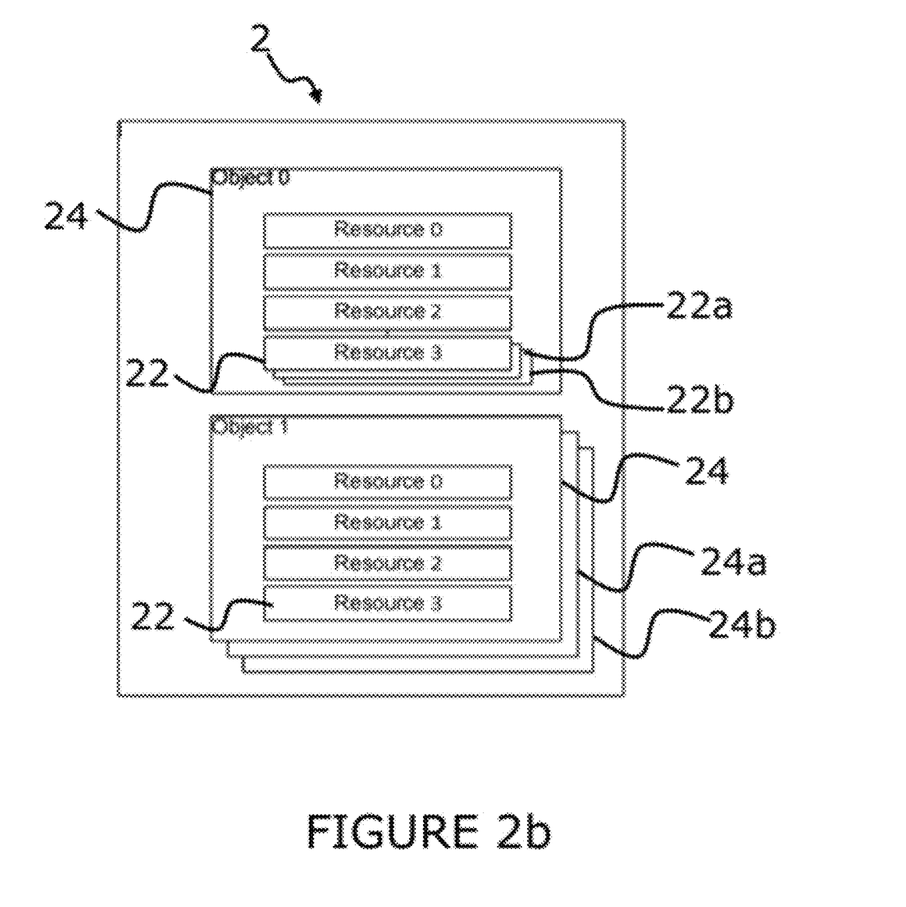
FIG. 2b shows a schematic diagram of an object model at the device of FIG. 1.

FIG. 2a illustratively shows an example architecture 20 which illustrates a client-server relationship between the device 2 and server 4. FIG. 2b illustratively shows a schematic diagram of an object model of device 2.

Device 2 is hereafter referred to as "client device" but may also be referred to herein as a 'device', 'node device', 'end-user device' or 'user device'.

In the following examples the server 4 is depicted as a LwM2M server, such that the LwM2M server 4 and client device 2 communicate using suitable protocols, such as those in compliance with the Open Mobile Alliance (OMA) LWM2M specification although the claims are not limited in this respect.

The client device 2 comprises client 21 which may be integrated as a software library or a built-in function of a module and which is used in communications with the LwM2M server 4. The client 21 may be a LwM2M client.

Logical interfaces may be defined between the client 21 and LwM2M server 4, and three logical interfaces are depicted in FIG. 2, namely:

'Client Registration' interface may be used to perform and maintain registration with one or more LwM2M servers and de-register from one or more LwM2M servers.

'Device management and service enablement' interface may be used by one or more servers to access object(s), object instances and resources available at the client device 2.

'Information Reporting' interface may be used to enable one or more servers to observe any changes in a resource on client device 2, and for receiving notifications when new values are available.

This list of logical interfaces is exemplary only and additional, or alternative, logical interfaces between the client 21 and LwM2M server 4 may be provided, for example, in accordance with the OMA LwM2M specification.

The device 2 comprises various resources 22, which can be read, written, executed and/or accessed by the LwM2M server 4 or one or more further servers/services.

As an illustrative example, a resource may comprise a value (e.g. generated by circuitry on the device). A web application may, via LwM2M server 4, request the value from the client device 2 (e.g. with a REPORT request), whereby the requested value is read and reported back to the web application by the LwM2M server 4.

As a further illustrative example, a resource may comprise credential data provisioned at manufacture (e.g. during a factory provisioning process) or during a communication session with a bootstrap server, and subsequently used to register with the LwM2M server 4.

As depicted in FIG. 2b, the resources 22 may be further logically organized into objects 24, whereby each device 2 can have any number of resources, each of which is associated with a respective object 24.

A set of objects on client device 2 may include, for example:

A 'security object' to handle security aspects between the client device 2 and one or more servers;

A 'server object' to define data and functions related to a server;

An 'access control object' to define for each of one or more permitted servers the access rights the one or more servers have for each object on the client device 2;

A 'device object' to detail resources on the client device 2. As an example, the device object may detail device information such as manufacturer, model, power information, free memory and error information;

A 'connectivity monitoring object' to group together resources on the client device 2 that assist in monitoring the status of a network connection;

A 'firmware update object' enables management of firmware which is to be updated, whereby the object includes installing firmware, updating firmware, and performing actions after updating firmware;

A 'location object' to group those resources that provide information about the current location of the client device 2;

A 'connection statistics object' to group together resources on the client device 2 that hold statistical information about an existing network connection.

In embodiments device 2 may have one or more instances of an object, three of which are depicted as 24, 24a and 24b in FIG. 2b. As an illustrative example, a temperature sensor device may comprise two or more temperature sensors, and the client device 2 may comprise a different device object instance for each temperature sensor.

In embodiments a resource may also comprise one or more resource instances which are depicted as 22, 22a, 22b in FIG. 2b.

In embodiments the objects, object instances, resources and resource instances are organised in an object hierarchy where each of the objects, object instances, resources and/or resource instances are elements of the object hierarchy, and whereby the device can enumerate the different elements of an object instance hierarchy using one or more characters (e.g. a text string; alphanumeric text, binary etc.)

Figure 2C:
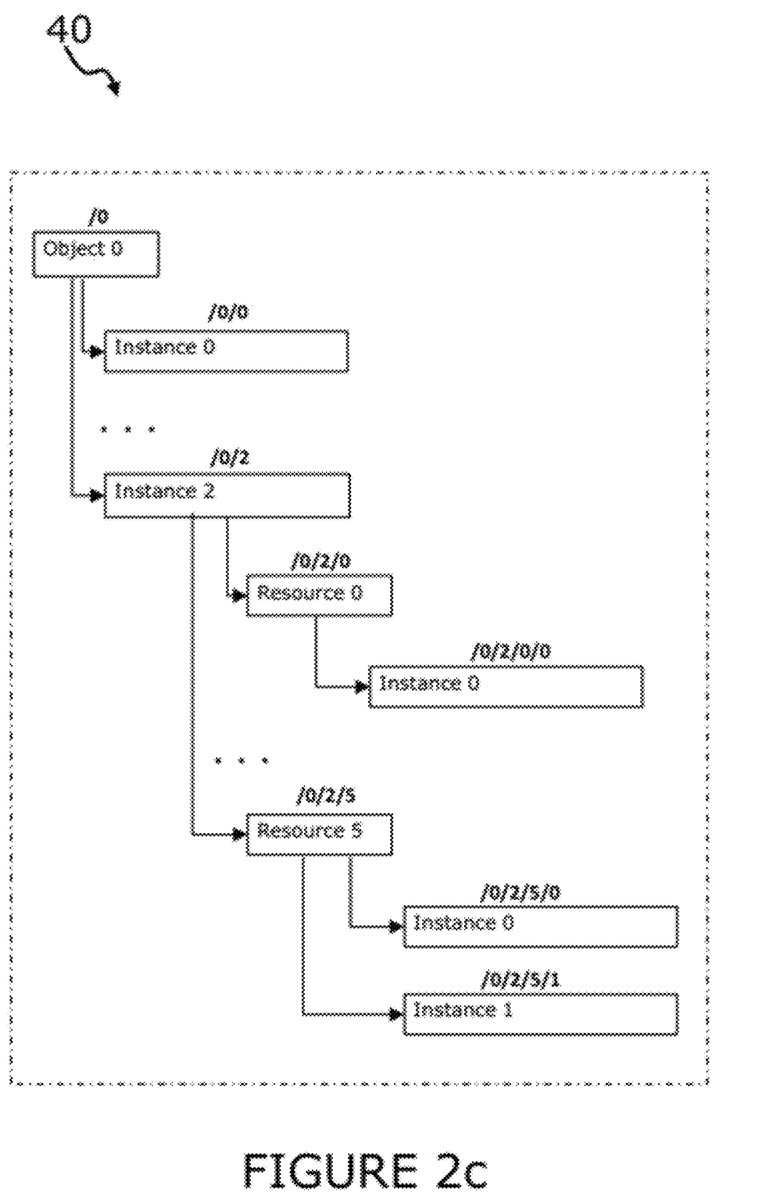
FIG. 2c shows one simplified example of a portion of an object hierarchy.

FIG. 2c shows one simplified example of a portion of such an object hierarchy 40, with omissions marked by elision marks ( . . . ). In FIG. 2c, object 0 instance 2 is shown as having a single instance of resource 0 (that is, resource 0 instance 0), and two instances of resource 5 (that is, resource 5 instance 0 and resource 5 instance 1). The elements of the hierarchy are further marked with a hierarchy notation showing the levels and elements within levels using a slash separator. It will be clear to one of ordinary skill in the art that this is merely one example of a hierarchy notation and is not intended to limit the structure of the hierarchies available using the present techniques. It will also be clear to those of skill in the art that real-world implementations of such hierarchies will be much larger, and that only a very simple example has been shown here.

In the hierarchy shown in FIG. 2c, an object may represent an LwM2M object. Instances of such objects are created according to the requirements of the system being implemented. Thus, for example, in a system for monitoring heating and cooling in a group of buildings, a Temperature object may be defined having instances for each of the buildings. The Temperature object instances may be defined to comprise resources, such as a Current Temperature resource, a Maximum Temperature resource and a Minimum Temperature resource, and each resource may further comprise instances for various temperature sensors.

On registration with a server, a device may then enumerate those elements of an object hierarchy which are to be registered using a suitable identifier, such as a universal resource indicator (URI), in the form:

/{Object ID}/{Object Instance}/{Resource ID} e.g. /3/0/1.

As such, the objects, object instances & resources on a client device may be remotely accessed/managed by, for example, software hosted on a server (e.g. a bootstrap server, LwM2M server 4) or an application running as part of a service 5.

In an embodiment the LwM2M server 4 comprises, or has access to a resource directory (depicted as resource directory 30 in FIG. 1) at the device management platform 8 (as depicted in FIG. 1), whereby the resources of the various client devices registered with the LwM2M server 4 are stored in the resource directory 30.

Thus, the resource directory 30 is a registry of the elements of the object hierarchy on one or more client devices registered with one or more servers. In embodiments the resource directory 30 may be realized using a processor and a storing device such as a hard disc drive and a suitable application, a database application in a computer or it may be realized using cloud computing.

In an embodiment client device 2 registers with a LwM2M server 4 by sending a registration request and providing various data (e.g. in a TLS/DTLS handshake), such as providing all of the objects, object instances, resources, and/or resource instances thereat (e.g. as a text string or individual identifiers). The LwM2M server 4 stores the identified objects, object instances, resources and/or resource instances in the resource directory 30 for the client device 2. Once the data is in the resource directory 30 the data can then be looked up and resources accessed as required.

As the number of objects, object instances, resources and/or resource instances on a client device increases, the size of the registration message will also increase and may impact the system capacity, especially when many client devices attempt to register with the LwM2M server 4 at substantially the same time.

To simplify the registration procedure and reduce the size of the registration request from a particular client device, the LwM2M server may use template-based registration, whereby the LwM2M server accesses resource templates which define objects, object instances, resources and/or resource instances for a particular device type. A resource template is a template of at least two pre-determined objects, object instances, resources and/or resource instances. In embodiment a resource template is associated with a device type.

In the present specification, the "device type" is defined by the objects, object instances and resources on a client device, whereby client devices of the same device type will have the same objects, object instances and resources, whilst client devices of a different device type will have different objects, object instances and resources. Moreover, the objects, object instances and resources may have different values on each device. As an illustrative example, a first client device having a first set of resources will be a different client device type to a second client device having a second set of resources, the second set of resources having at least one additional or alternative resource than the first set of resources.

Referring again to FIG. 1, resource templates may be stored in storage 32 on the device management platform 8, hereafter "template storage" 32.

In an illustrative example, when a client device 2 registers with the LwM2M server 4 and the objects, object instances, resources and/or resource instances at that client device 2 match the objects, object instances, resources and/or resource instances specified in a resource template in template storage 30, the LwM2M server 4 can store the objects, object instances, resources and/or resource instances identified in the resource template in the resource directory 30 to register that client device 2 at the device management platform 8.

In such a scenario the client device 2 can identify the resource template by providing a template identifier in the registration request, where the template identifier may be provisioned on the client device 2 by bootstrap server 6 during a bootstrap process. Such functionality means that the client device 2 is not required to provide all of its objects, object instances, resources and/or resource instances to the LwM2M server 4, rather it just transmits a template identifier to provide for template-based registration.

When installed and powered up, a client device is configured to register itself with a server, and sends a registration message to the server. An example of the message is as follows:

POST/rd?ep=endpoint1&rt=type&tmpl&d=domain1

In at least one disclosed embodiment, the client device includes two pieces of information in the query string of the registration message. The first is a template flag ("tmpl" in the above example), which indicates that the client device requests the server to use template based registration. The second is the device type identification or the semantic device type ("type" in this example), which is used as a template identifier to enable a server receiving the message to obtain the corresponding resource template. In embodiments, a server receiving a registration message with a template identifier but without a template flag will recognize the template identifier as a request for the server to use template based registration.

When the server receives such a registration, it checks template storage 32 for the resource template corresponding to the template identifier, and when available, registers that client device 2 by storing the objects, object instances, resources and/or resource instances identified in the resource template in the resource directory 30 for the client device.

In embodiments one or more of the object(s), object instance(s), resource(s) and resource instance(s) on a client device may change over time (e.g. following a firmware update), thereby changing the device type of that client device.

When a client device requires registration elements in the object hierarchy in addition, or as an alternative, to those elements defined in the resource template, the client device may include an expression enumerating these additional or alternative individual elements of the object hierarchy. For example, the device may provide an expression comprising comma separated elements within the registration message depicted in the/custom "rt" parameter below as:

POST/rd?ep=endpoint1&rt=type&tmpl&d=domain1</custom>;rt="<3/0/1/, 3/0/2, 3/0/5 . . . "

There may be no limit on the number of additional or alternative elements which the user may want to define, and so the resulting registration message may comprise a relatively large amount of data for a constrained client device to generate/process. Furthermore, as the of devices increases the overhead for processing customised messages may place a burden on the server.

The present techniques provide for reducing the size of a registration message for template-based registration.

Figure 3:
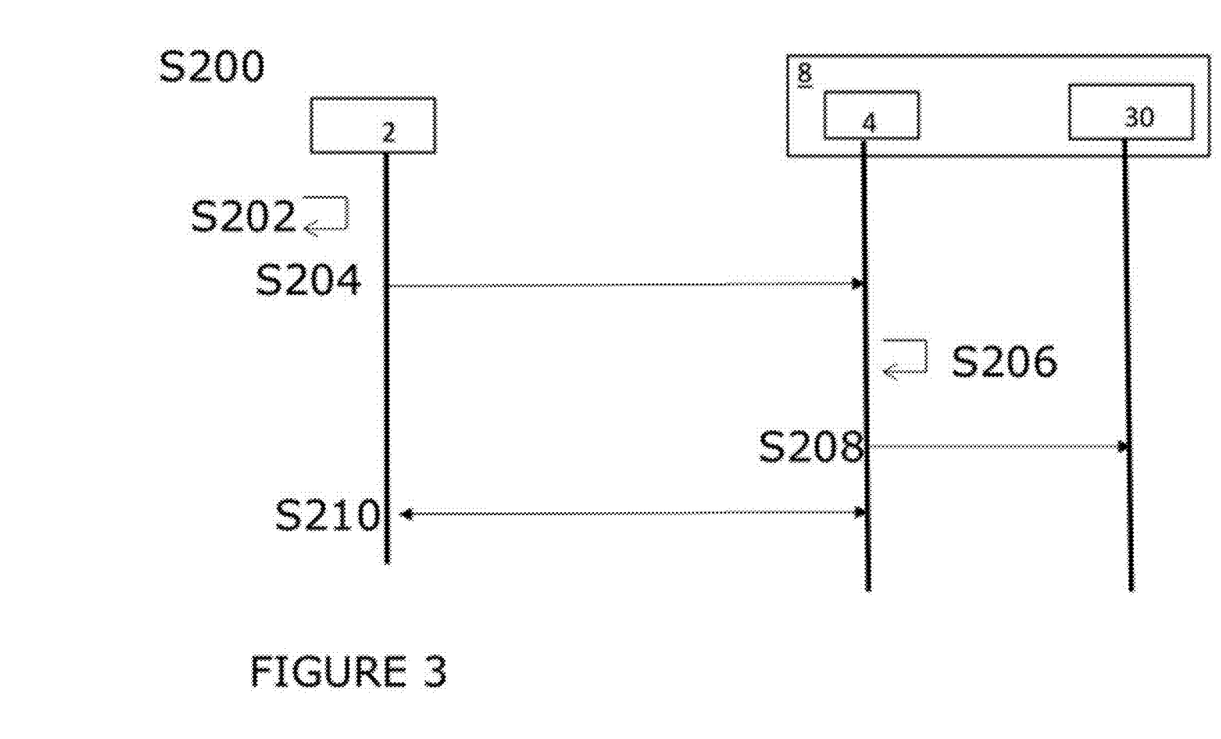
FIG. 3 shows an example process in which a client device registers with a server.

FIG. 3 shows an example process in which a client device 2 may reduce the size of its registration message when registering with a server.

At S202, client device generates a registration message comprising a template identifier which corresponds to a resource template defining one or more objects, object instances, resources and/or resource instances at the device.

The client device also applies a data reducing function to one or more of the object(s), object instance(s), resource(s) and resource instance(s) on the client device 2 not defined within the resource template to which the template identifier relates. The output of the data reducing function comprises compressed data representative of at least one element of the device's object hierarchy and is hereafter referred to as "resource data".

In an illustrative example, the client device 2 may apply the data reducing function to a some or all of the object(s), object instance(s), resource(s) and resource instance(s) thereon, and use the resource data in the registration message to signify that the object(s), object instance(s), resource(s) and resource instance(s) corresponding to the resource data should be used in the registration along with the object(s), object instance(s), resource(s) and/or resource instance(s) defined in the resource template corresponding to the template identifier. In embodiments, the resource data may indicate that fewer object(s), object instance(s), resource(s) and/or resource instance(s) should be used in the registration than those in the resource template.

At S204 the client device sends the registration message comprising inter alia the template identifier and resource data to the server 4, whereby the resource data is provided as an additional parameter along with a template identifier 'type', e.g.:

POST/rd?ep=endpoint1&rt=type&tmpl&d=domain1</custom>;rt="<resourcedata>"

Alternatively, when the device applies the data reducing function to all of the object(s), object instance(s), resource(s) and resource instance(s) thereon the resource data may be used as the template identifier e.g.:

POST/rd?ep=endpoint1&rt=resourcedata&tmpl&d=domain1

At S206, the server 4 processes the registration message to obtain the object(s), object instance(s), resource(s) and resource instance(s) corresponding to the resource data and/or the template identifier, and, at S208 stores the obtained object(s), object instance(s), resource(s) and resource instance(s) in the resource directory 30 to register the client device 2.

When the server cannot obtain the object(s), object instance(s), resource(s) and resource instance(s), it will notify the client device 2 (e.g. via an error message), and the client device can perform a full registration, providing individual identifiers for all the object(s), object instance(s), resource(s) and/or resource instance(s) thereon.

As will be appreciated, the registration message comprising the resource data will be smaller than a registration message comprising all individual identifiers for all the object(s), object instance(s), resource(s) and/or resource instance(s) (e.g. in the rt parameter).

When registration is complete the client device 2 may access the server 4 and vice versa.

In an embodiment the data reducing function is a compression function such as run-length encoding (RLE), Huffman encoding and/or Lempel-Ziv compression. In a further embodiment the data reducing function is a hashing function such as MD5, SHA, Adler32 Checksum etc. Such hashing functions may be one-way hashing function It will be appreciated that these examples of data reducing functions are exemplary only and any suitable data reducing function may be used.

On receiving the registration message with the resource data, the server can obtain the object(s), object instance(s), resource(s) and resource instance(s) corresponding to the resource data in any suitable manner.

In an illustrative example, when the resource data is a hash value, the server can compare the hash value to precalculated hashes in storage at the device management platform (e.g. in a hash table). When there is a match, the corresponding object(s), object instance(s), resource(s) and resource instance(s) can be used to register the client device.

In a further illustrative example when the resource data is a hash value, the server can use the same hashing algorithm used by the client device to create hash values using object(s), object instance(s), resource(s) and resource instance(s) in storage on the server (or accessible thereto) as inputs. When there is a match, the corresponding object(s), object instance(s), resource(s) and resource instance(s) can be used to register the client device.

In a further illustrative example, when the resource data is reversible, the server may decompress or reverse the resource data to obtain the corresponding object(s), object instance(s), resource(s) and resource instance(s).

Figure 4:
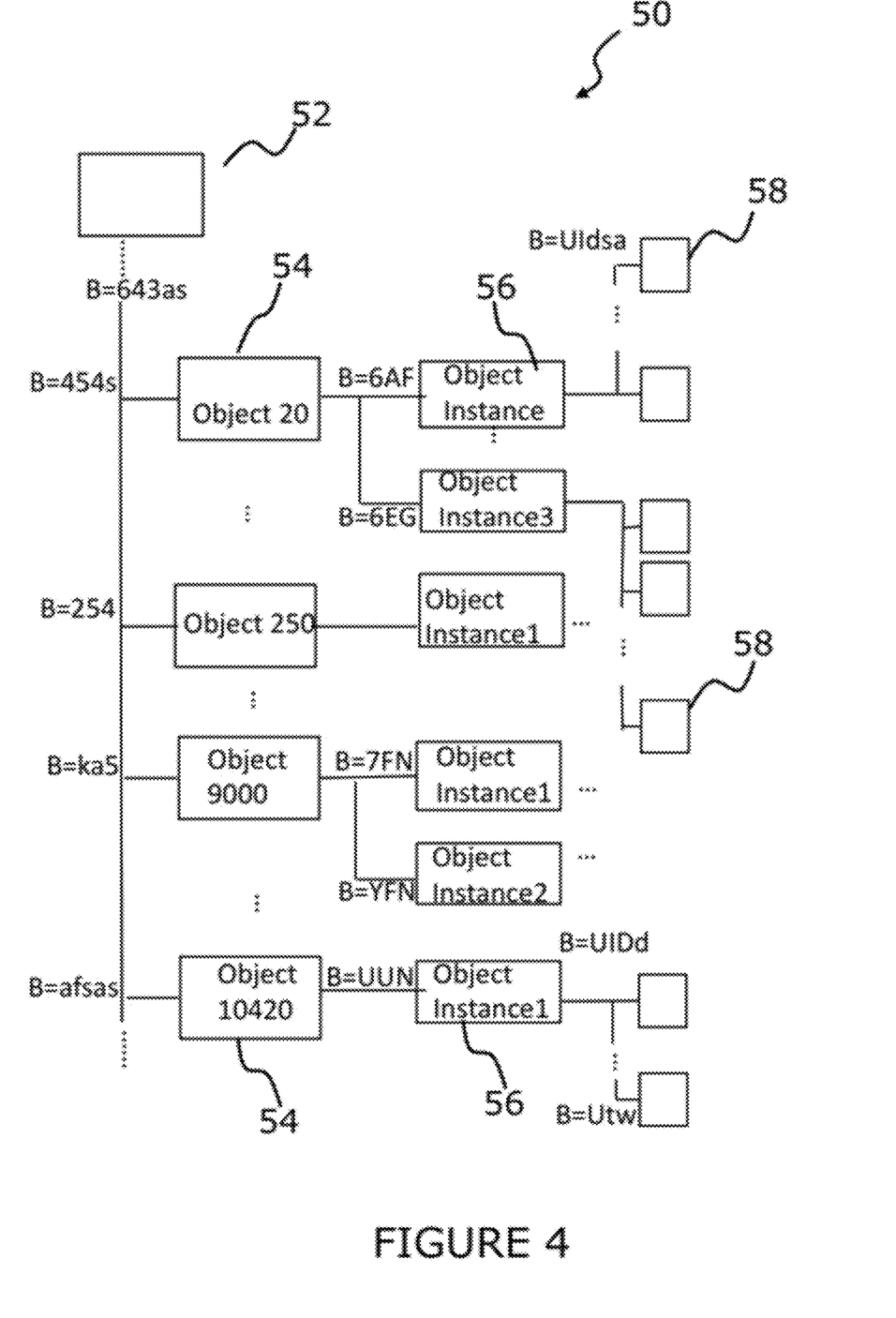
FIG. 4 shows an example of a data structure representative of all resources available to the device management platform according to an embodiment.

FIG. 4 illustratively shows an example of a data structure 50 depicting an object instance hierarchy which can be used by the server to identify object(s), object instance(s), resource(s) and resource instance(s).

The data structure 50 is representative of resources available to the device management platform and structured in a hierarchical manner, whereby the root node 52 represents the set of available resources. Each device attempting to register with device management platform will likely have a subset of the resources available to the device management platform.

Object nodes 54 each represent a subset of the resources of the root node 52.

Object instance nodes 56 each represent a subset of the resources of the respective object nodes 54.

Resource nodes 58 each represent a subset of the resources of the respective object instance nodes 56. A further branch may originate from the respective resource to provide resource instance nodes (not shown in FIG. 4)

Each branch of the data structure comprises a group of object(s), object instance(s), resource(s) and/or resource instance(s) and is allocated a different group identifier (B). The group identifiers are depicted as being alphanumeric values in FIG. 4, although the claims are not limited in this respect.

In an embodiment the group identifiers for a branch may be obtained by applying a data reducing function (e.g. a hash function) to all the resources of the respective nodes of that branch (e.g. by applying the hash function to all identifiers of the resources).

In an embodiment the client device may generate group identifiers by performing a data reducing function on the respective object(s), object instance(s), resource(s) and/or resource instance(s) thereon to provide resource data corresponding to the group identifiers in the data structure 50. Such functionality reduces the size of the registration message as the devices do not have to transmit individual identifiers for all the object(s), object instance(s), resource(s) and/or resource instance(s).

In some embodiments the client devices may be pre-provisioned with resource data corresponding to the group identifiers during a bootstrapping process or via a gateway apparatus. Additionally, or alternatively, the client devices may be provisioned with a data structure for the object(s), object instance(s), resource(s) and/or resource instance(s) thereon and may select the group identifiers from the data structure as resource data. Such functionality reduces the computational/processing burden on client devices in comparison to having to generate the respective resource data.

Such functionality also means that different devices can provide different device data in the respective registration messages and the receiving server will determine which object(s), object instance(s), resource(s) and/or resource instance(s) are required to register each of the different devices. For example, client devices 2A and 2B could both implement resources identified by group identifiers B=454s and B=afsas, and include these group identifiers in the registration process. Similarly, both client devices could implement different sub-branches from each other and include the group identifiers for the different sub-branches in the respective registration messages.

In a further embodiment object(s), object instance(s), resource(s) and/or resource instance(s) available to the device management platform may be grouped together other than by branches of the data structure.

Figure 5:
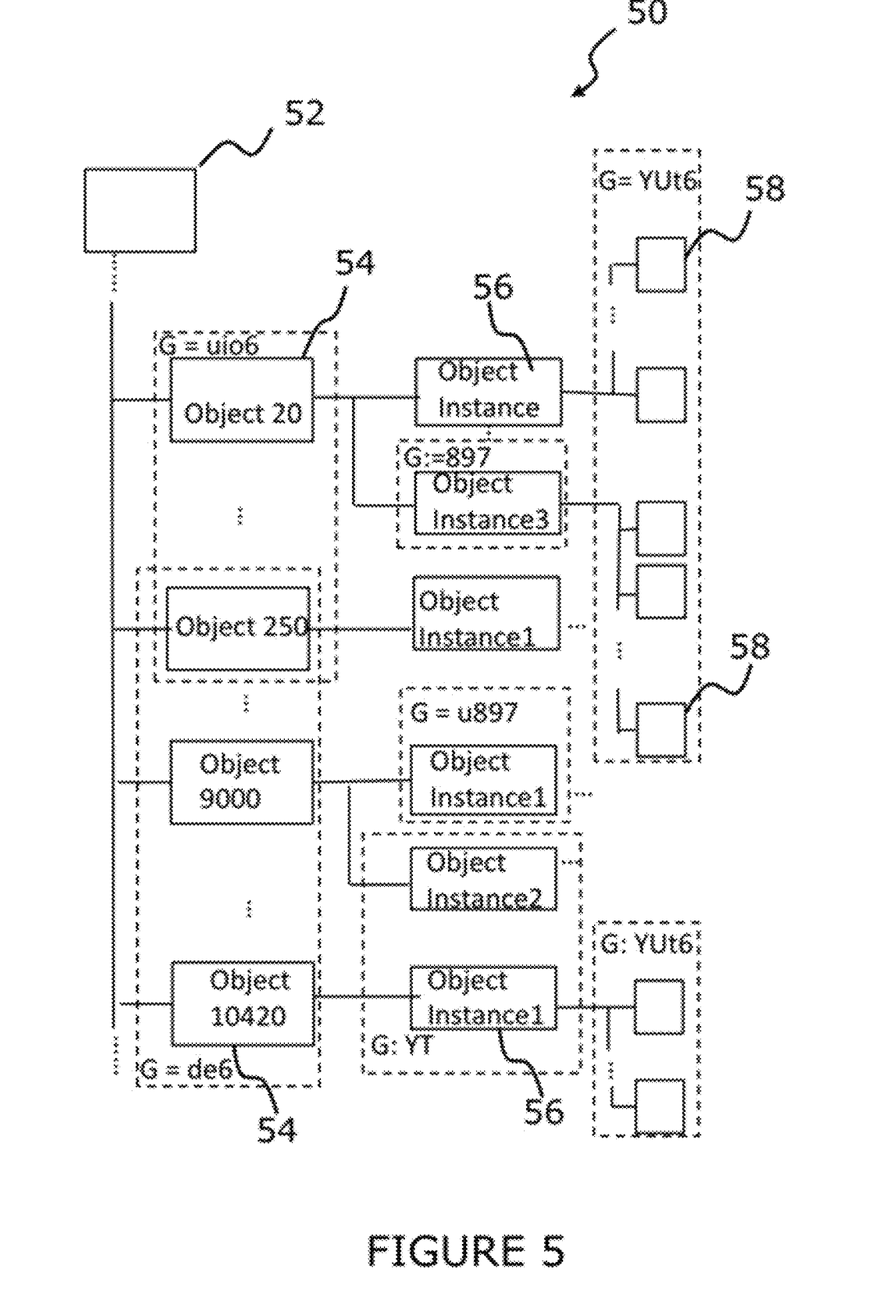
FIG. 5 shows an example of a data structure representative of all resources available to the device management platform according to an embodiment.

As depicted in FIG. 5, the object(s), object instance(s) and resource(s) in data structure 50 are grouped and identified by a group identifier (G), whereby group identifier "G=uio6" corresponds to all objects from object 20 to object 250; group identifier "G=YT" corresponds to object instances 1 and 2 of object 10420; group identifier "G=u897" corresponds to object instance 3 of object 20 and object instance 1 of object 9000; group identifier "G=uio6" corresponds to all objects from object 250 to object 10420; and group identifier "G=YUt6" corresponds to the resources of object 20 and object 10420. The groups depicted in FIG. 5 are illustrative only and any number of groupings may be assigned.

In an embodiment the group identifier may be obtained by the device management platform (e.g. a server or service thereat) applying a data reducing function to the resources of the objects, object instances, resources and/or resources assigned to each group (e.g. by applying the data reducing function to the identifiers of the respective object(s), object instance(s), resource(s) and/or resource instance(s)). As depicted in FIG. 5, a group may have one or more overlapping elements with another group.

As will be appreciated, client devices may generate the respective group identifiers by performing a data reducing function on the respective object(s), object instance(s), resource(s) and/or resource instance(s) thereon to provide resource data corresponding to the groups. Such functionality reduces the size of the registration message as the devices do not have to transmit individual identifiers for all the object(s), object instance(s), resource(s) and/or resource instance(s).

In some embodiments the client devices may be pre-provisioned with the resource data corresponding to the group identifiers during a bootstrapping process. Additionally, or alternatively, the client devices may be provisioned with a data structure for the object(s), object instance(s), resource(s) and/or resource instance(s) thereon and may select the group identifiers from the data structure.

Such functionality reduces the computational/processing burden on client devices in comparison to having to generate the resource data.

Thus, the client devices can transmit resource data corresponding to one or more group identifiers as part of a registration message, and a receiving server can determine which object(s), object instance(s), resource(s) and/or resource instance(s) are required to register the client device.

The data structure also reduces the computational/processing burden on the device management platform because when the group identifiers are generated once, they can be stored and looked-up for each device registration and will not be required to be generated until they are updated or modified.

As will be appreciated, a client device may use the group identifiers as template identifiers in the registration message.

In embodiments one or more object(s), object instance(s), resource(s) and resource instance(s) on a client device may change over time (e.g. following a firmware update), thereby changing the device type of that client device. A server (e.g. bootstrap server or LwM2M server) may generate updated resource data for a new device type and pre-provision the resource data on the updated device. Accordingly, the device management platform may dynamically learn the group identifiers and deliver them to client devices or gateway apparatus in advance of the device type changing. Such dynamic learning may be based on customer/user/administrator input-configurations, device types being connected to the other gateways associated with the customer account, geographical cues etc. although the claims are not limited in this respect.

Whilst the objects, object instances, resources and/or resource instances may be represented by resource data comprising alphanumeric values as depicted with the group identifiers, the claims are not limited in this respect, and in other embodiments the object(s), object instance(s), resource(s) and/or resource instance(s) may be represented by resource data comprising code, such as binary code (e.g. from 1 bit to n-bits).

As an illustrative example, the client device may be configured to apply a data reducing function so as to identify its resources as resource data comprising a bit stream or bit string, whereby each bit is representative of an object, object instance, resource or resource instance. For example, when a bit in the bit string is set to a value of '1' the client device has that corresponding object, object instance, resource or resource instance (i.e. the value '1' is taken to indicate the presence of the corresponding object, object instance, resource or resource instance at the client device); and when the bit is set to a value of '0', then the client device does not have that corresponding object, object instance, resource or resource instance (i.e. the value '0' is taken to indicate the absence of the corresponding object, object instance, resource or resource instance from the client device).

The group identifiers may also be identified by bit values, whereby the client device will identify the desired resources by providing the bit values as resource data. For example, the most commonly requested objects, object instances or resources for devices may be grouped together and identified with a group identifier comprising a single bit. The next most commonly requested objects, object instances or resources for devices may be grouped together and identified with two bits, and so on. Alternatively, the most commonly requested branch in the data structure may be identified with a group identifier comprising a single bit. The next most commonly requested branch may be identified with a group identifier comprising two bits and so on.

When a client device requires the objects, object instances or resources in that group it will then be able to identify that group using one or more bits.

On receiving the registration message, the server will parse the resource data and identify which object(s), object instance(s), resource(s) or resource instance(s) are required to register the client device. As an illustrative example, each bit in the bit string may correspond to a particular object, object instance, resource or resource instance. Such functionality means that an object, object instance, resource or resource instance can be identified with one or more bits. As a further illustrative example, each object, object instance, resource and/or resource instance may be defined by a bit code (e.g. 2 or more bits), such that when a device requires a particular object, object instance, resource or resource instance on registration it will include that bit code in the resource data.

Devices having a first primary function (e.g. temperature sensors) may request some or different object(s), object instance(s) and/or resources more frequently than devices of have a different primary function (e.g. chemical sensors). Thus, the objects, object instances, resources and/or resource instances may be grouped differently, or the group identifiers assigned differently dependent on the client devices. The device management platform may determine which group identifiers to use dependent on one or more device identifiers received from the client device (e.g. an endpoint identifier), whilst each client device will be provisioned with the appropriate data to generate the required template identifier or resource template.

As above, the bit string may be used as or in addition to a template identifier in the registration message.

In an embodiment, to reduce the size of the registration message, the client device may be configured to apply a data reducing function to provide resource data comprising a unitary compressed expression encapsulating, in a single expression, the plurality of elements of the object hierarchy to be used by a server to register the client device.

As an illustrative example, a registration message may comprise a unitary compressed expression comprising a wildcard symbol, thus making the server operable to respond to any activity associated with any of the elements of the object hierarchy that fall within the group specified by the wildcard symbol.

An illustrative example of a wildcard symbol includes the asterisk '*' which may be used by a client device to request all object instances of an object, or all resources of an object (or object instance). The device may apply the data reducing function such that resource data comprises a compressed expression in the form:

POST/rd?ep=endpoint1&rt=type&tmpl&d=domain1</custom>;rt="<"/3/0/*>.

The server would recognise the resource data to relate to all object instances and resources of object 3, object instance 0.

A further illustrative example of a wildcard symbol includes the question mark '?' which may be used by a client device to request particular objects, object instances, or resources. The device may apply the data reducing function such that resource data comprises a compressed expression in the form:

POST/rd?ep=endpoint1&rt=type&tmpl&d=domain1</custom>;rt="<"/3/?/3>.

The server would recognise the resource data to relate to the resource 3 of any object instance of object 3.3

A further illustrative example of a wildcard symbol is the open and close brackets '[ ]' which may be used by a client device to request particular objects, object instances, resources and/or resource instances in a range. The device may apply the data reducing function such that resource data comprises a compressed expression in the form:

POST/rd?ep=endpoint1&rt=type&tmpl&d=domain1</custom>;rt="<"/3/0/[3-7]>.

The server would recognise the resource data relate to all resources 3 to 7 inclusive, of object instance 0 of object 3.

The example compressed expressions are exemplary only, and any characters or symbols may be used to reduce a corresponding non-compressed expression.

Using compressed expressions reduces the registration message in comparison to the device having to provide individual identifiers for all the object(s), object instance(s), resource(s) and/or resource instance(s) thereon. In a further illustrative example, a registration message may comprise a unitary compressed expression in the form of a regular expression defining the criteria to be met by an element that will make the device operable to respond to any activity associated with any of the elements that fall within those specified by the regular expression. For example, such a regular expression may specify a set of values identifying elements that have names containing a specified embedded string. A regular expression may comprise a specification of those parts of the definition of an object, object instance, resource or resource instance in the object hierarchy that are required to match the criteria, and it may contain indicators that some parts of the definition of an object, object instance, resource or resource instance in the object hierarchy are to be ignored. It will be clear to one of ordinary skill in the art that these are merely examples, and that the unitary compressed expression may take many other forms, according to the requirements of the application that is the consumer of the information provided by the client device in response to activity associated with identifying elements of the client device's object hierarchy to the server.

As above, a compressed expression may be used as or in addition to a template identifier in the registration message.

In embodiments the data reducing algorithm used by the client device to generate resource data may be pre-shared with the server. Additionally, or alternatively, the client device may provide a hint as to which data reducing algorithm was used to generate the resource data (e.g. by providing a flag or code in the registration message or as part of a TLS/DTLS handshake with the server).

The present techniques provide for reducing the size of a registration message from a device to a server.

Furthermore, whilst the server 4 above is generally described as a LwM2M server, the claims are not limited in this respect and in embodiments the server 4 may be an OMA Device Management (DM), a TR-069 server or a server which follows a standard/protocol set by the Open Connectivity Foundation or Open Interconnect Consortium.

Embodiments of the present techniques may provide implementations which conform to the Open Mobile Alliance Lightweight Machine to Machine Technical Specification, Version 1.0 and to one or more revision(s) thereof, including, for example, Versions 1.0.2, 1.1 and 1.3. It will be appreciated that the claims are not limited in this respect.

Embodiments of the present techniques also provide a non-transitory data carrier carrying code which, when implemented on a processor, causes the processor to carry out the methods described herein.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory data carrier or on a non-transitory computer-readable medium such as a disk, microprocessor, CD- or DVD-ROM, programmed memory such as read-only memory (firmware), or on a data carrier such as an optical or electrical signal carrier. The code may be provided on a (non-transitory) carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform all the steps of the above-described method.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from any inventive concept as defined in the appended claims.

The invention claimed is:

1. A machine-implemented method of registering a device with a server for an application-specific system, the method performed at the device comprising:
  selecting at least one branch of a data structure as at least one selected branch, the data structure identifying specific resources available to the device from a root node representative of a set of all resources, each branch of the data structure comprising a group of an identified object, an identified object instance, an identified resource, and an identified resource instance at the device,
  wherein the at least one selected branch is structured hierarchically including:
    the identified object as a child node of the root node and representative of a subset of all resources of the root node, the identified object being available to the device through an identified object identifier,
    the identified object instance as a child node of the identified object and representative of a specific instance of the identified object created according to requirements of the application-specific system, the identified object instance being available to the device through an identified object instance identifier defined by hierarchy through the identified object identifier, the identified resource as a child node of the identified object instance and representative of a specific resource of the identified object instance, the identified resource being available to the device through an identified resource identifier defined by hierarchy through the identified object instance identifier and the identified object identifier, and the identified resource instance as a child node of the identified resource and representative of a specific instance of the identified resource created according to requirements of the application-specific system, the identified resource instance being available to the device through an identified resource instance identifier defined by hierarchy through the identified resource identifier, the identified object instance identifier, and the identified object identifier;

applying a data-reducing function to the at least one selected branch at the device by applying the data-reducing function to each of the identified object identifier, the identified object instance identifier, the identified resource identifier, and the identified resource instance identifier to generate reversibly compressed resource data corresponding to a group identifier identifying at least one group of the at least one selected branch;

transmitting, to a server, a registration message comprising the reversibly compressed resource data, an indicator to indicate that the server is to use template based registration, and a template identifier configured to enable the server to obtain a corresponding template, and wherein the registration message is configured to enable the server to register the device using the resource data and the corresponding template, and wherein the reversibly compressed resource data can be reversed to obtain the identified object, the identified object instance, the identified resource, and the identified resource instance; and accessing the server when registration is complete.

2. The method of claim 1, wherein the device comprises an LwM2M device and/or wherein the server comprises an LwM2M server.

3. The method of claim 1, wherein the data-reducing function is a compression function and reversing the reversibly compressed resource data comprises applying a decompression function on the reversibly compressed resource data.

4. The method of claim 1, further comprising after the group identifier is initially generated, storing the group identifier and not modifying the group identifier unless the group is modified.

5. The method of claim 1, wherein the at least one selected branch is identified by a most commonly requested group identifier of all devices having access to the specific resources.

6. The method of claim 1, wherein the at least one selected branch is identified by a second most commonly requested group identifier of all devices having access to the specific resources.

7. The method of claim 1, wherein the identified object, the identified object instance, the identified resource, and the identified resource instance are grouped in a first grouping associated with a primary function of the device.

8. The method of claim 7, wherein the identified object, the identified object instance, the identified resource, and the identified resource instance are grouped in a second grouping associated with a primary function of a second device, the second grouping being different than the first grouping.

9. The method of claim 7, wherein the group identifier is further defined according to a device identifier.

10. The method of claim 1, wherein at least one of the identified object identifier, the identified object instance identifier, the identified resource identifier, or the identified resource instance identifier in the group identifier are defined by a compressed expression defining a plurality of respective elements.

11. The method of claim 10, wherein the compressed expression is a wildcard defining all of the respective elements for one of the identified object, the identified object instance, the identified resource, or the identified resource instance.

12. The method of claim 10, wherein the compressed expression is a range defining a subset of the respective elements for one of the identified object, the identified object instance, the identified resource, or the identified resource instance.

13. The method of claim 1, wherein the corresponding template is associated with a device type defined by the specific resources available to the device, wherein a second device of a same device type has the same objects, object instances, resources, and resource instances as the device.

14. The method of claim 1, wherein the corresponding template is associated with a device type defined by the specific resources available to the device, and wherein the device type changes for the device when at least one of the specific resources available to the device changes.

15. The method of claim 1, wherein the specific resources available to the device are a subset of all resources available to the server.

16. A machine-implemented method for registering a device with a server for an application-specific system, the method performed at the server comprising:

receiving a registration message including:
  reversibly compressed resource data corresponding to a group identifier identifying a group of an identified object, an identified object instance, an identified resource, and an identified resource instance at the device, the group being of a branch of a data structure identifying specific resources available to the device from a root node representative of a set of all resources, wherein the at least one selected branch is structured hierarchically including:
    the identified object as a child node of the root node and representative of a subset of all resources of the root node, the identified object being available to the device through an identified object identifier,
    the identified object instance as a child node of the identified object and representative of a specific instance of the identified object created according to requirements of the application-specific system, the identified object instance being available to the device through an identified object instance identifier defined by hierarchy through the identified object identifier,
    the identified resource as a child node of the identified object instance and representative of a specific resource of the identified object instance, the identified resource being available to the device through an identified resource identifier defined by hierarchy through the identified object instance identifier and the identified object identifier, and
    the identified resource instance as a child node of the identified resource and representative of a specific instance of the identified resource created according to requirements of the application-specific system, the identified resource instance being available to the device through an identified resource instance identifier defined by hierarchy through the identified resource identifier, the identified object instance identifier, and the identified object identifier;

an indicator to indicate that the server is to use template based registration; and a template identifier;

obtaining a template corresponding to the template identifier;

reversing the reversibly compressed resource data to obtain the identified object, the identified object instance, the identified resource, and the identified resource instance; and registering the device using the template and the identified object, the identified object instance, the identified resource and the identified resource instance determined to be at the device.

17. The method of claim 16, wherein reversing the reversibly compressed resource data comprises applying a decompression function on the reversibly compressed resource data.

18. The method of claim 16, wherein the group identifier is further defined according to a device identifier, and registering the device further comprises determining which group identifier to use among a plurality of group identifiers depending on the device identifier received from the client device.

19. A non-transitory computer readable storage medium comprising code which when implemented on a processor causes the processor to carry out the method of claim 1.

20. A device comprising:

processing circuitry;

storage circuitry; and, communication circuitry; and wherein the device is to perform the method of claim 1.

* * * * *